(12) United States Patent
Miyata et al.

(10) Patent No.: US 11,935,806 B2
(45) Date of Patent: Mar. 19, 2024

(54) SEMICONDUCTOR DEVICE AND METHOD FOR MANUFACTURING SEMICONDUCTOR DEVICE

(71) Applicant: NICHIA CORPORATION, Anan (JP)

(72) Inventors: Tadaaki Miyata, Yokohama (JP); Yoshihiro Kimura, Yokohama (JP); Masatoshi Nakagaki, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 300 days.

(21) Appl. No.: 17/368,608

(22) Filed: Jul. 6, 2021

(65) Prior Publication Data
US 2022/0013429 A1 Jan. 13, 2022

(30) Foreign Application Priority Data

Jul. 10, 2020 (JP) .................................. 2020-119320
May 17, 2021 (JP) .................................. 2021-083469

(51) Int. Cl.
*H01L 23/367* (2006.01)
*H01L 23/373* (2006.01)
*H01L 23/498* (2006.01)

(52) U.S. Cl.
CPC ........ *H01L 23/367* (2013.01); *H01L 23/3736* (2013.01); *H01L 23/49811* (2013.01); *H01L 23/49838* (2013.01)

(58) Field of Classification Search
CPC ............... H01L 23/367; H01L 23/3736; H01L 23/49811; H01L 23/49838; H01L 23/3735;

(Continued)

(56) References Cited

U.S. PATENT DOCUMENTS 8,476,656 B2 7/2013 Kadotani
9,507,112 B2 11/2016 Yasuda et al.
(Continued)

FOREIGN PATENT DOCUMENTS

JP 2002-170908 A 6/2002
JP 2005-317594 A 11/2005
(Continued)

OTHER PUBLICATIONS

Jiachen Xu, Mingfang Wu, Juan Pu, Songbai Xue, "Novel Au-Based Solder Alloys: A Potential Answer for Electrical Packaging Problem", Advances in Materials Science and Engineering, vol. 2020, Article ID 4969647, 16 pages, 2020 (Year: 2020).*

(Continued)

*Primary Examiner* — Benjamin P Sandvik
*Assistant Examiner* — John Patrick Cornely
(74) *Attorney, Agent, or Firm* — Foley & Lardner LLP

(57) ABSTRACT

A semiconductor device includes: a semiconductor element; a submount on which the semiconductor element is mounted, wherein the submount has a first surface on which the semiconductor element is mounted, a second surface located on a side opposite the first surface, and a lateral surface located between the first surface and the second surface, and wherein the submount comprises: a groove located at the second surface, a heat dissipation portion located at the second surface, and an electrode pattern located at the first surface; a package substrate on which the submount is mounted; a first joint member that physically joins the heat dissipation portion to the package substrate; and a connection portion located on the side surface, wherein the connection portion electrically connects the electrode pattern and the package substrate, and the connection portion comprises a second joint member.

11 Claims, 14 Drawing Sheets

(58) Field of Classification Search
CPC .............. H01L 23/49833; H01L 23/15; H01L 23/49805; H01L 23/13
See application file for complete search history.

(56) References Cited

U.S. PATENT DOCUMENTS

| | | | |
|---|---|---|---|
| 9,538,636 B1* | 1/2017 | Weigand | ................. H01L 23/14 |
| 2020/0083150 A1* | 3/2020 | Shimizu | ................ H01L 21/561 |

FOREIGN PATENT DOCUMENTS

| | | | |
|---|---|---|---|
| JP | 2005-332983 A | 12/2005 | |
| JP | 2007-110032 A | 4/2007 | |
| JP | 2010-080640 A | 4/2010 | |
| JP | 2012-151243 A | 8/2012 | |
| JP | 2012-160527 A | 8/2012 | |
| JP | 2018-152465 A | 9/2018 | |
| JP | 2018-182035 A | 11/2018 | |

OTHER PUBLICATIONS

Tianqi Hu, Hongtao Chen, Mingyu Li, "Die attach materials with high remelting temperatures created by bonding Cu@Sn microparticles at lower temperatures", Materials & Design, vol. 108, 2016, pp. 383-390, ISSN 0264-1275 (Year: 2016).*

* cited by examiner

SEMICONDUCTOR DEVICE AND METHOD FOR MANUFACTURING SEMICONDUCTOR DEVICE

CROSS-REFERENCE TO RELATED APPLICATIONS

This application claims priority to Japanese Patent Application No. 2020-119320, filed on Jul. 10, 2020, and Japanese Patent Application No. 2021-083469, filed on May 17, 2021, the disclosures of which are hereby incorporated by reference in the entirety.

BACKGROUND

The present disclosure relates to a semiconductor device and a method for manufacturing a semiconductor device.

A semiconductor module reduced in size by disposing a semiconductor element such as an optical semiconductor and a power semiconductor in a package has been widely used.

A light emitting diode configuration has been known in which a semi-circular through channel is formed in a lateral surface of a circuit board on which a light emitting diode element is mounted, and a heat dissipation terminal and a bottom surface electrode terminal connected to the through channel are formed on a back surface of the circuit board (for example, see Japanese Patent Publication No. 2010-080640).

SUMMARY

The amount of heat generated by a semiconductor element disposed in a package is great, and a configuration that efficiently releases the heat is required. However, when a wiring for heat dissipation and a wiring for an electrical connection are provided, there is a risk that the size of a semiconductor device may increase. A configuration that reduces a wiring area responsible for electrical connection and reduces the size of a semiconductor device is needed.

One object of the present disclosure is to reduce a wiring area and reduce the size of a semiconductor device.

In one embodiment of the present disclosure, a semiconductor device includes a semiconductor element, a submount on which the semiconductor element is mounted, and a package substrate on which the submount is mounted. The submount includes a first surface on which the semiconductor element is mounted, a second surface located on an opposite side to the first surface, and a lateral surface located between the first surface and the second surface. The second surface includes a groove and a heat dissipation portion. The heat dissipation portion is physically joined to the package substrate by a first joint member. A connection portion that electrically connects the submount and the package substrate by a second joint member is provided on the lateral surface. The heat dissipation portion and the connection portion are separated by the groove and are electrically insulated.

The configuration described above can reduce a wiring area and reduce the size of a semiconductor device.

DETAILED DESCRIPTION

<Configuration of Semiconductor Device>

Figure 1:
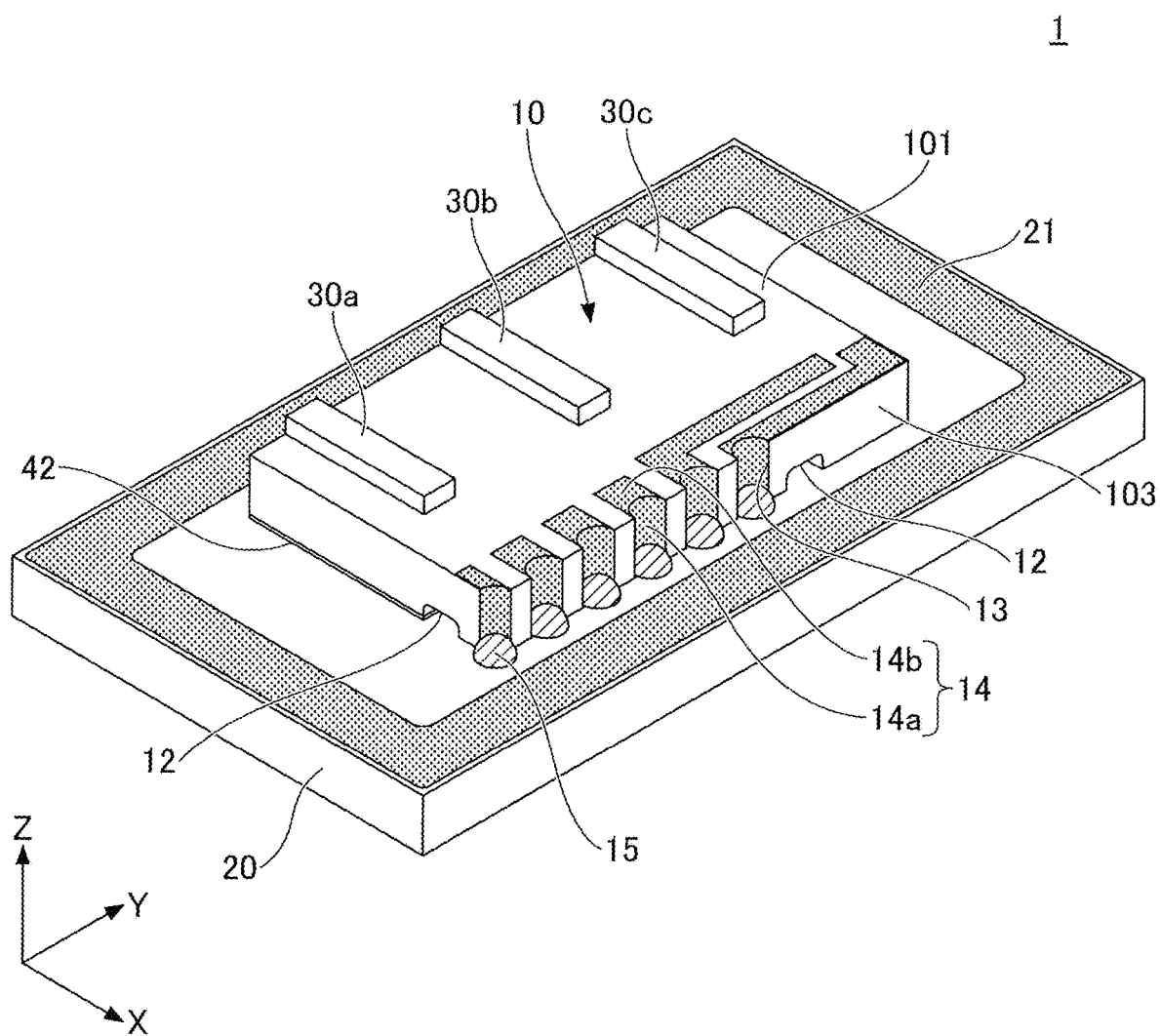
FIG. 1 is a diagram illustrating a mounting state of a submount in a semiconductor device according to an embodiment.
Figure 2:
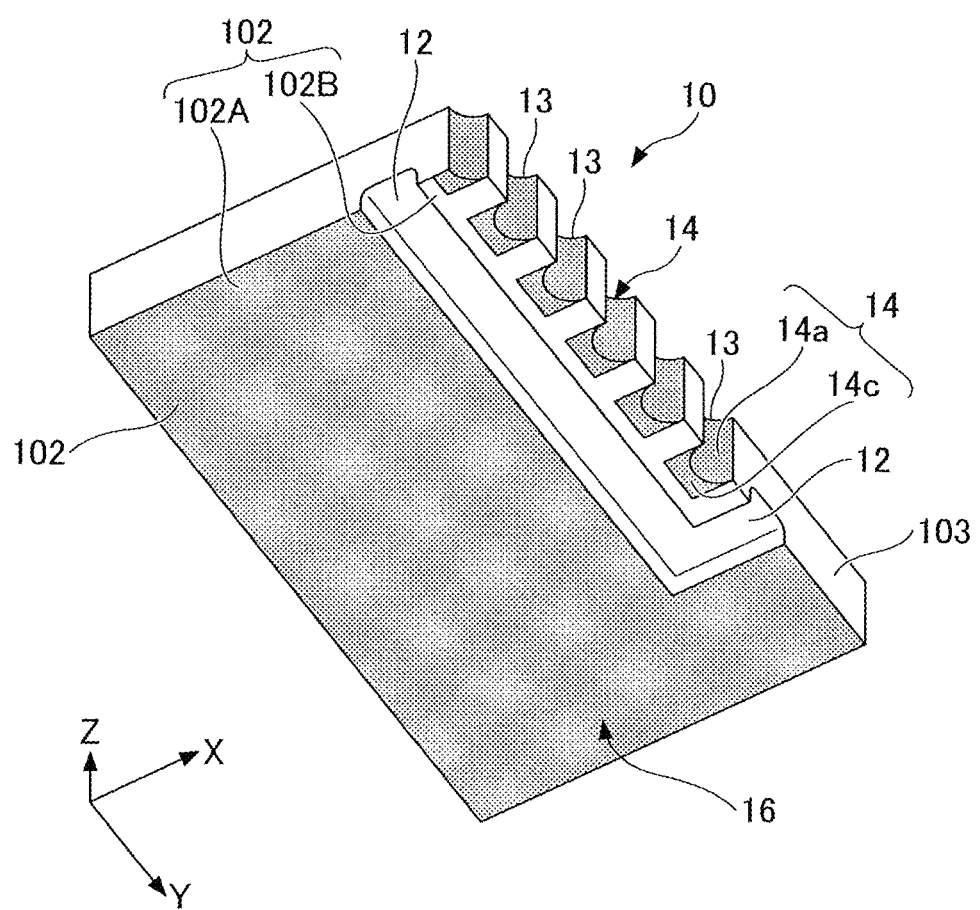
FIG. 2 is a diagram illustrating a shape of a back surface and a lateral surface of the submount.

FIG. 1 is a diagram illustrating a mounting state of a submount 10 in a semiconductor device 1 according to an embodiment. FIG. 2 is a diagram illustrating a shape of a back surface and a lateral surface of the submount 10 used in the semiconductor device 1. In FIG. 1, a plane on which the submount 10 is mounted is referred to as an X-Y plane, and a direction perpendicular to the X-Y plane is a Z direction. The Z direction corresponds to a height direction of the submount 10.

The semiconductor device 1 includes semiconductor elements 30a, 30b, and 30c (hereinafter, collectively referred to as "semiconductor elements 30"), the submount 10 on which the semiconductor elements 30 are mounted, and a package substrate 20 on which the submount 10 is mounted. In FIG. 1, the three semiconductor elements 30 are mounted on the submount 10, but the present disclosure is not limited to this example. A single semiconductor element 30 can be mounted on the submount 10, or a plurality of semiconductor elements 30 can be arranged in a one-dimensional or two-dimensional array.

In FIG. 1, an optical semiconductor element such as a laser diode (LD) is mounted as the semiconductor element 30 on the submount 10, but the present disclosure is not limited to this example. A power semiconductor element such as a rectifier or a booster can be mounted on the submount 10, or a single light emitting device (LED) or array of LEDs can be mounted.

A main portion of submount 10 (that is, a portion other than a heat dissipation portion 16 and the electrode pattern 14b, described below) is formed of a material that is electrically insulative and thermally conductive. Aluminum nitride (AlN), silicon nitride ($Si_3Na_4$), silicon carbide (SiC), and the like can be used as a material of the main portion of the submount 10. The submount 10 has a first surface on which the semiconductor element 30 is mounted, a second surface on an opposite side to the first surface, and a lateral surface 103 between the first surface and the second surface. Here, the first surface is a top surface 101 of the submount 10, and the second surface is a back surface 102 of the submount 10.

As illustrated in FIG. 2, the back surface 102 of the submount 10 includes a groove 12 and a heat dissipation portion 16. The groove 12 is formed directly in the back surface 102 of the submount 10. The heat dissipation portion 16 is formed of a metal film that has good thermal conductivity, and the like. At the time of mounting of the submount 10, the heat dissipation portion 16 is physically fixed to the package substrate 20 by a first joint member 42 formed by curing a first joint material 41.

An end face through channel 13 is formed in the lateral surface 103 of the submount 10 so as to electrically join the submount 10 and the package substrate 20. The end face through channel 13 penetrates the submount 10 in a thickness direction, but is open or exposed to the outside in the lateral surface 103. Such a through channel is referred to as an "end face through channel."

A lateral wall of the end face through channel 13 is covered with a conductive film 14a. The conductive film 14a extends to the top surface 101 of the submount 10 and is continuous with an electrode pattern 14b at the top surface 101. The conductive film 14a covering the lateral wall of the end face through channel 13 also extends to the back surface 102 of the submount 10. A conductive film 14c surrounding a periphery of the end face through channel 13 is formed on the back surface 102 of the submount 10. The conductive films 14a and 14c and the electrode pattern 14b together are a conductive film 14.

On the back surface 102 of the submount 10, the heat dissipation portion 16 and the conductive film 14c extending from the end face through channel 13 are electrically separated by the groove 12. Of the back surface 102, a region in which the heat dissipation portion 16 is provided is a first region 102A, and a region separated from the heat dissipation portion 16 by the groove 12 is referred to as a second region 102B. The heat dissipation portion 16 can also be used only for heat dissipation without contributing to electrical joining between the submount 10 and the package substrate 20. As described later, the groove 12 can also house an excess portion of the first joint member 42, and can prevent an electrical short circuit in the package. In this way, a heat dissipation property can be maintained while a wiring area is reduced and the size of the semiconductor device is reduced.

The conductive film 14c is separated from the groove 12 on the back surface 102 of the submount 10, and surrounds the periphery of the end face through channel 13. An electrical short circuit in the package is also prevented by the conductive film 14c being separated from the groove 12.

FIG. 1 illustrates a state in which a metal ball 15 is placed in the end face through channel 13 immediately before final electrical joining between the submount 10 and the package substrate 20 is acquired. The metal ball 15 is an example of a "second joint material." The metal ball 15 is formed of Sn, Au, Ag, Cu, Ni, Bi, In, or the like, or lead free solder such as AuSn, SnBi, and Sn—Ag—Cu (referred to as "SAC") formed of a plurality of materials of Sn, Au, Ag, Cu, Ni, Bi, and In.

By heating the metal ball 15 from the state illustrated in FIG. 1, the metal ball 15 melts, and wets and spreads in a fillet shape from the conductive film 14a in the end face through channel 13 to form an electrically conductive fillet as the second joint member. The electrically conductive fillet is in contact with the conductive film 14a and the surface of the package substrate 20, and has a shape in which an outer lateral surface of the electrically conductive fillet and the electrically conductive film are increasingly separated as the outer lateral surface gets closer to the package substrate 20. The heat treatment results in electrical joining between the submount 10 and the package substrate 20.

Here, the second joint material is described as the metal ball 15, but AuSn and the like can be formed as the second joint material by plating or the like. Further, a shape of the second joint material is not limited to a ball type, and can be a stud type or a cylindrical type. In both cases, it is preferable that a melting temperature before joining of the first joint member 42 is lower than a melting temperature of the second joint material (for example, the metal ball 15), and a melting temperature after joining of the first joint member 42 is higher than the melting temperature of the second joint material (for example, the metal ball 15). Note that the melting temperature of the first joint member 42 is a temperature at which the member starts to melt.

The submount 10 is fixed to a fixed place on the surface of the package substrate 20 by the first joint member 42 even during heat treatment of the metal ball 15. It is preferable that the first joint member 42 is formed by using a material containing nanoparticles or microparticles that includes, for example, nanoparticles or microparticles of at least one selected from Ag, Cu, Au, and the like. Further, a material identical or similar to that of the metal ball 15 can be used. For example, in a case in which AuSn is used, a remelting temperature can be higher than the melting temperature of the metal ball 15 by increasing the amount of Au diffused during melting. Further, for a use that does not require heat dissipation, a resin-containing metal melting material can also be used.

Subsequent to completion of the electrical joining between the submount 10 and the package substrate 20, the submount 10 and the semiconductor element 30 are sealed. As an example, a cover is put on the package substrate 20 and joined to a metal pattern 21 formed along the periphery of the package substrate 20.

Figure 3:
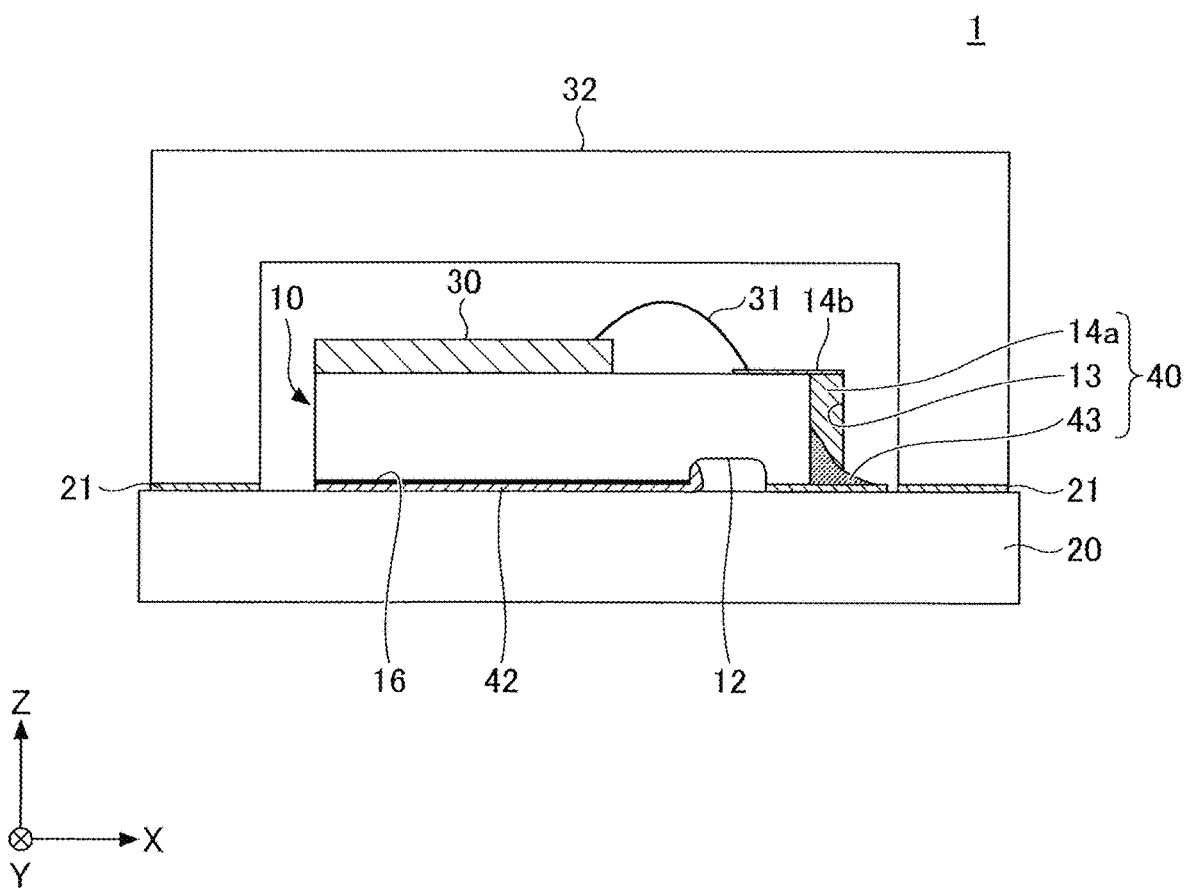
FIG. 3 is a schematic cross-sectional view of a packaged semiconductor device.

FIG. 3 is a schematic cross-sectional view of the semiconductor device 1 in which the submount 10 and the semiconductor element 30 are sealed. A cover 32 is put on the package substrate 20, and the semiconductor element 30 mounted on the submount 10 is encapsulated. The cover 32 can be formed of glass, ceramic, insulating resin, and the like. In a case in which the semiconductor element 30 is an LD, a window that transmits emitted light from the LD can be formed in the cover 32. In a case in which the semiconductor element 30 is a power semiconductor, the cover 32 can be formed of metal, glass, resin, ceramic, and the like having high thermal conductivity.

A bottom surface of the cover 32 is joined to the metal pattern 21 of the package substrate 20. In FIG. 3, the cover 32 is put on the package substrate 20, but the package substrate 20 can be housed in a casing and covered with a flat cover.

The semiconductor element 30 mounted on the submount 10 can be connected to the electrode pattern 14b by a wire 31 and the like. On at least a part of the lateral surface 103 (see FIG. 1) of the submount 10, an electrically conductive fillet 43 as the second joint member is formed in the end face through channel 13, and the submount 10 and the package substrate 20 are electrically connected. Specifically, the conductive film 14 (including the conductive films 14a and 14c, and the electrode pattern 14b) and the electrically conductive fillet 43 that are formed in the end face through channel 13 form an electrical connection portion 40.

The heat dissipation portion 16 on the back surface of the submount 10 is separated from the connection portion 40 by the groove 12, and does not contribute to an electrical connection between the submount 10 and the package substrate 20. The heat dissipation portion 16 can also be used only as a function of releasing heat generated by the semiconductor element 30 from the package substrate 20 to the outside, and has good heat dissipation efficiency.

The first joint member 42 that fixes the heat dissipation portion 16 to the package substrate 20 can be partially located inside the groove 12. The presence of the groove 12 can prevent the metal material from wetting and spreading, and reaching the electrical connection portion 40 at the time of physical joining of the heat dissipation portion 16. Further, different materials can be used for the first joint member 42 and the metal ball 15.

<Manufacturing Step of Semiconductor Device>

Figure 4:
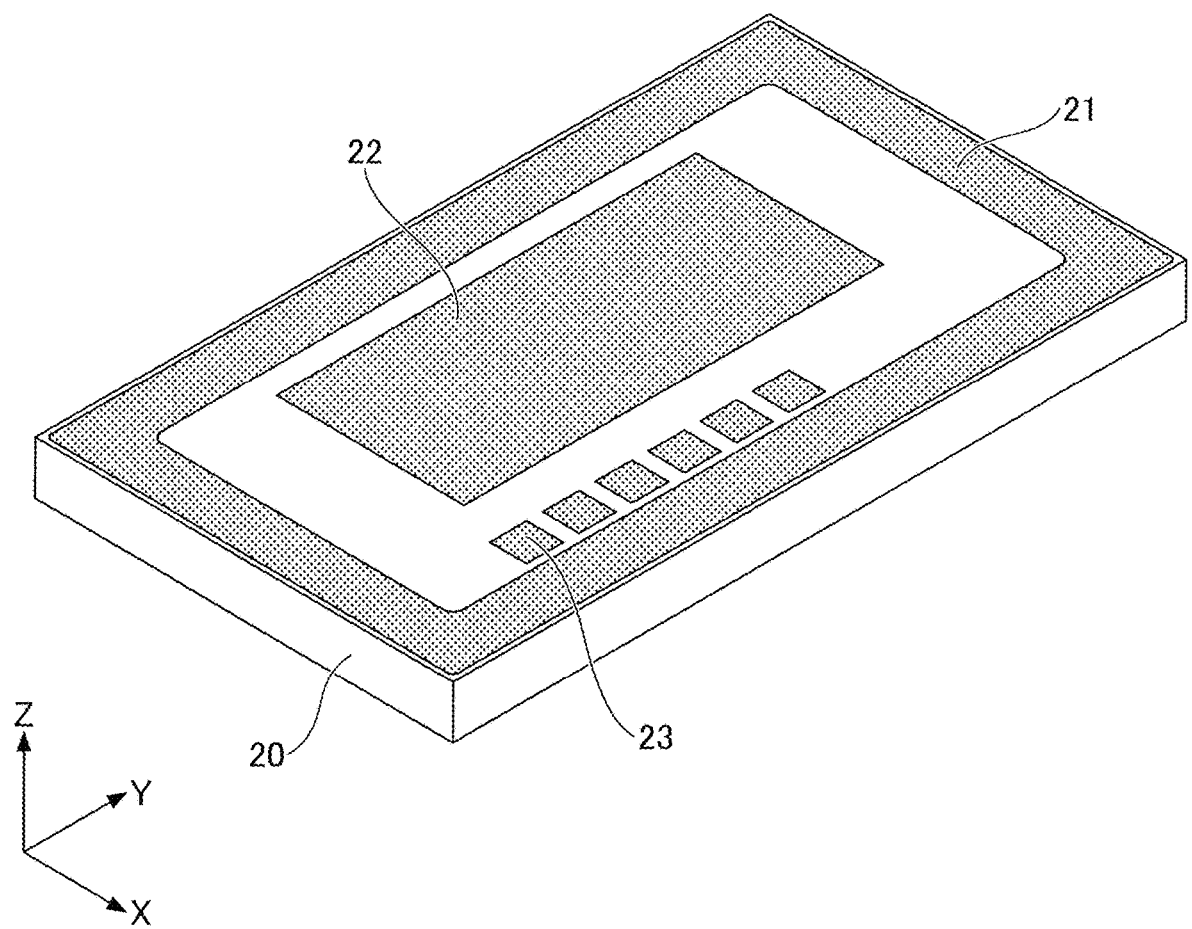
FIG. 4 is a manufacturing step diagram of the semiconductor device.

FIGS. 4 to 8 are perspective views each illustrating a manufacturing step of the semiconductor device 1. In FIG. 4, the package substrate 20 for mounting the submount 10 is provided. A predetermined electrode terminal 23 is formed in advance on the package substrate 20. The electrode terminal 23 can be connected to a wiring inside the package substrate 20.

In addition to the metal pattern 21 for encapsulation, a metal pattern 22 that fixes the submount 10 is formed on the package substrate 20. The metal pattern 22 fixes the heat dissipation portion 16 of the submount 10 to the package substrate 20, and releases, together with the heat dissipation portion 16, heat from the semiconductor element 30 to the package substrate 20. The metal pattern 22 is formed of a material having good thermal conductivity, and also functions as a heat sink.

Figure 5:
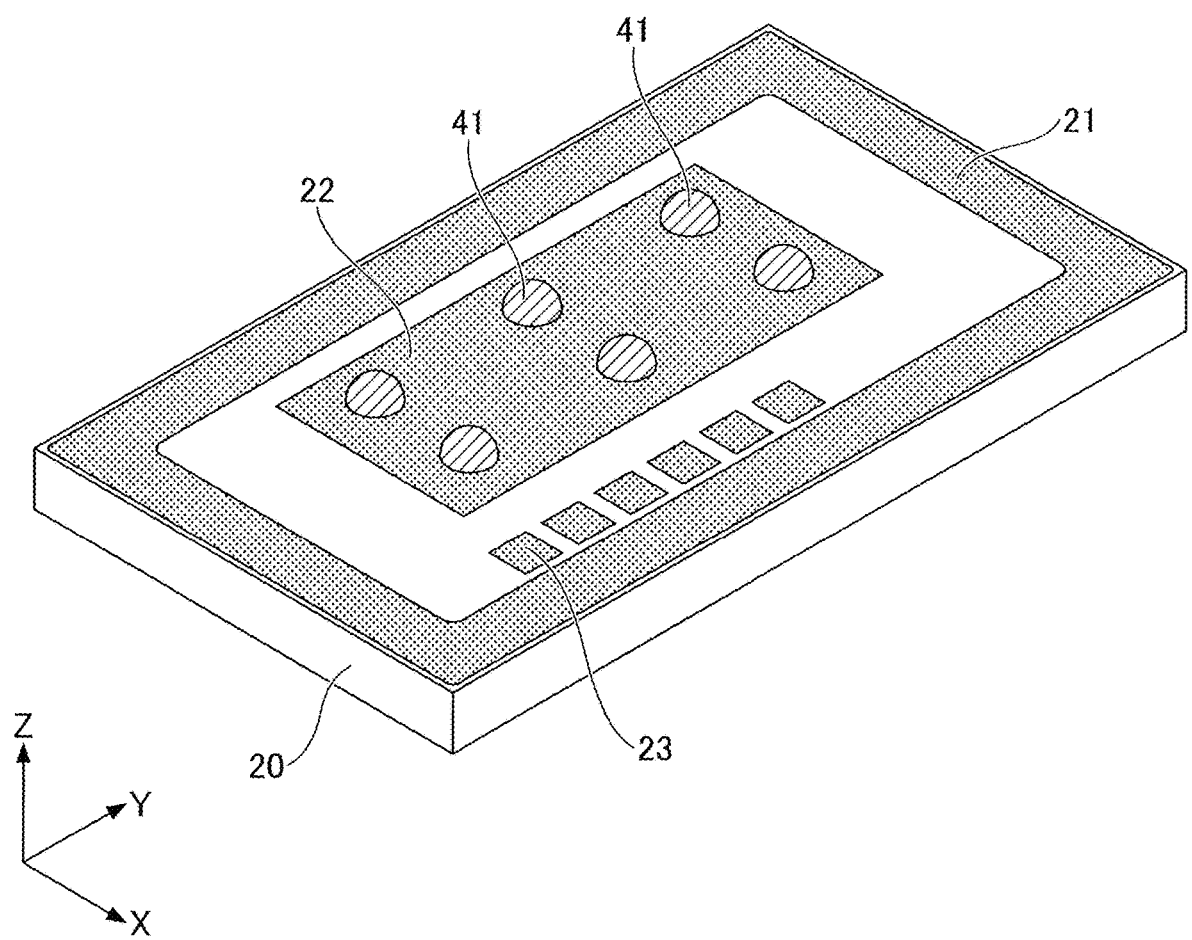
FIG. 5 is a manufacturing step diagram of the semiconductor device.

In FIG. 5, a first joint material 41 for fixing the heat dissipation portion 16 of the submount 10 is disposed on the metal pattern 22 by using a dispenser or the like. As the first joint material 41, nanoparticles or microparticles of metal such as Au, Ag, and Cu, metal paste or metal nanopaste of Au, Ag, and Cu, and the like can be used. In a case in which nanoparticles are used, the first joint material 41 can include metal nanoparticles and an organic solvent.

Figure 6:
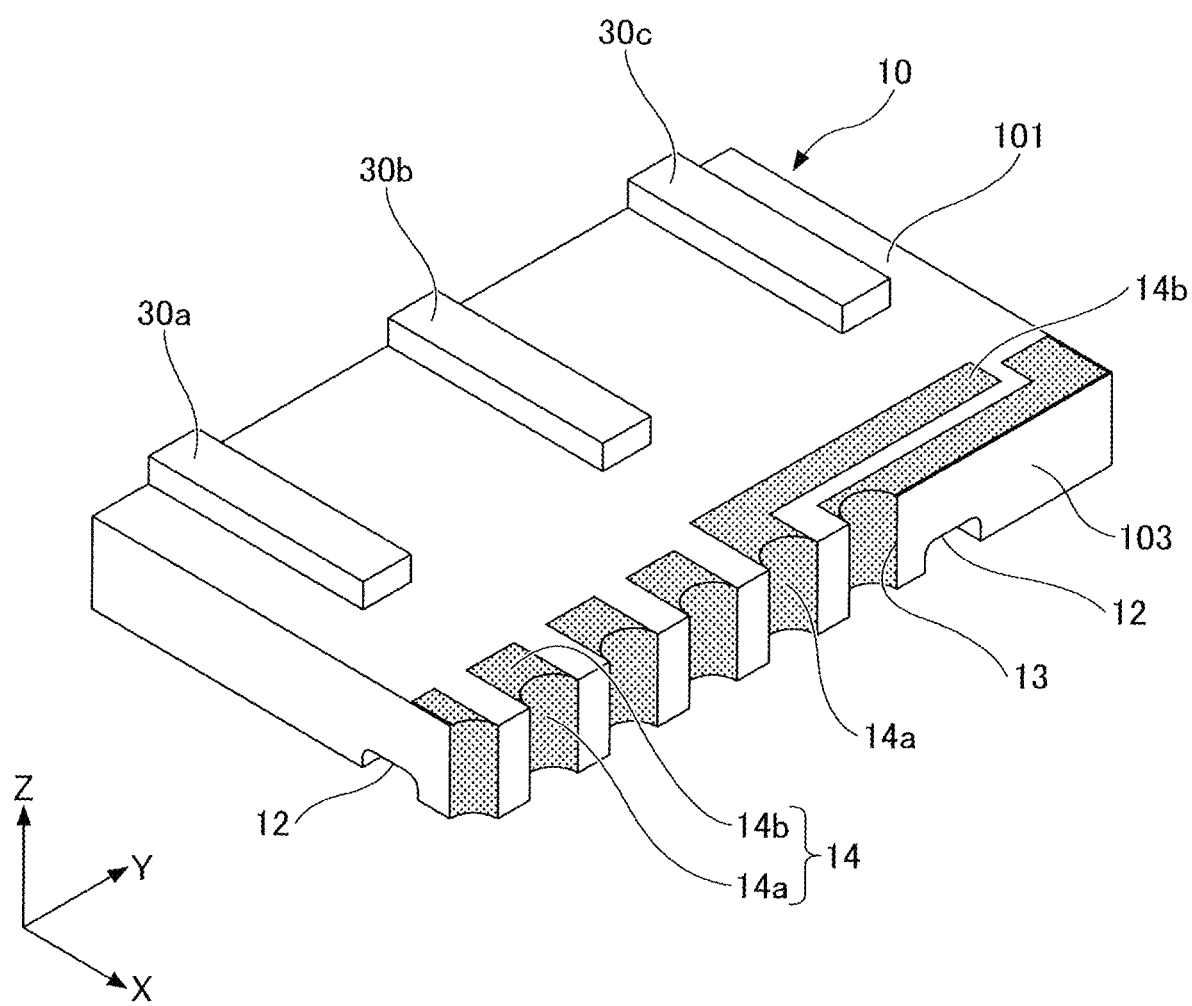
FIG. 6 is a manufacturing step diagram of the semiconductor device.

In FIG. 6, the submount 10 is provided. The submount 10 includes the heat dissipation portion 16 and the groove 12 on the back surface 102 (see FIG. 2), and has the end face through channel 13 in the lateral surface 103. The end face through channel 13 is separated from the groove 12, and the conductive film 14a is formed on the lateral wall. The electrode pattern 14b continuous from the conductive film 14a is formed at the top surface 101 of the submount 10. The semiconductor elements 30a to 30c are mounted on the submount 10.

Figure 7:
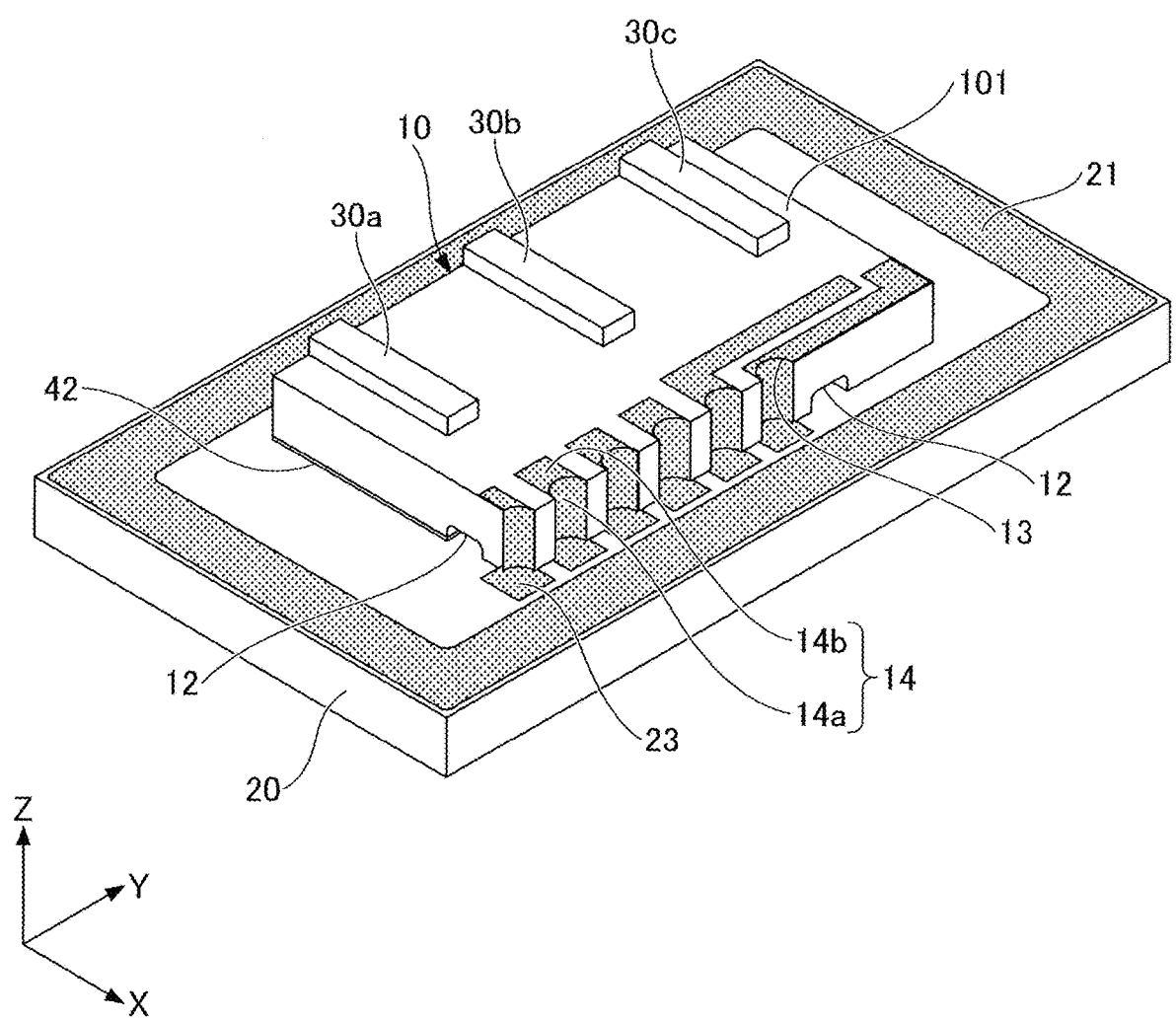
FIG. 7 is a manufacturing step diagram of the semiconductor device.

In FIG. 7, the submount 10 is fixed to the package substrate 20. This fixing is physical joining by the first joint material 41 (see FIG. 5) and is joining that does not contribute to an electrical connection between the submount 10 and the package substrate 20. Joining using the first joint material 41 is heat joining. A heating temperature is 150° C. to 270° C. The heating temperature is lower than a heating temperature that forms the electrical connection portion 40 by the metal ball 15.

Due to load application when the submount 10 is mounted on the package substrate 20, the first joint material 41 wets and spreads between the heat dissipation portion 16 of the submount 10 and the metal pattern 22 of the package substrate 20. Subsequently, by heat curing, the heat dissipation portion 16 of the submount 10 is fixed to the package substrate 20 by the first joint member 42. Note that load application and heating can be performed simultaneously.

The electrode terminals 23 are formed on the package substrate 20 at a narrow pitch of 30 µm to 1000 µm, and the end face through channels 13 covered with the conductive film 14 are also formed in the lateral surface 103 of the submount 10 at a narrow pitch of 30 um to 1000 um. By fixing the submount 10, the end face through channels 13 of the submount 10 are aligned with the electrode terminals 23 on the package substrate 20. Even when the excess first joint material 41 wets and spreads during heat bonding, the excess first joint material 41 is located in the groove 12 in the back surface 102 of the submount 10, and a short circuit between the first joint material 41 and the electrode terminal 23 and between the first joint material 41 and the conductive film 14 can be prevented.

Figure 8:
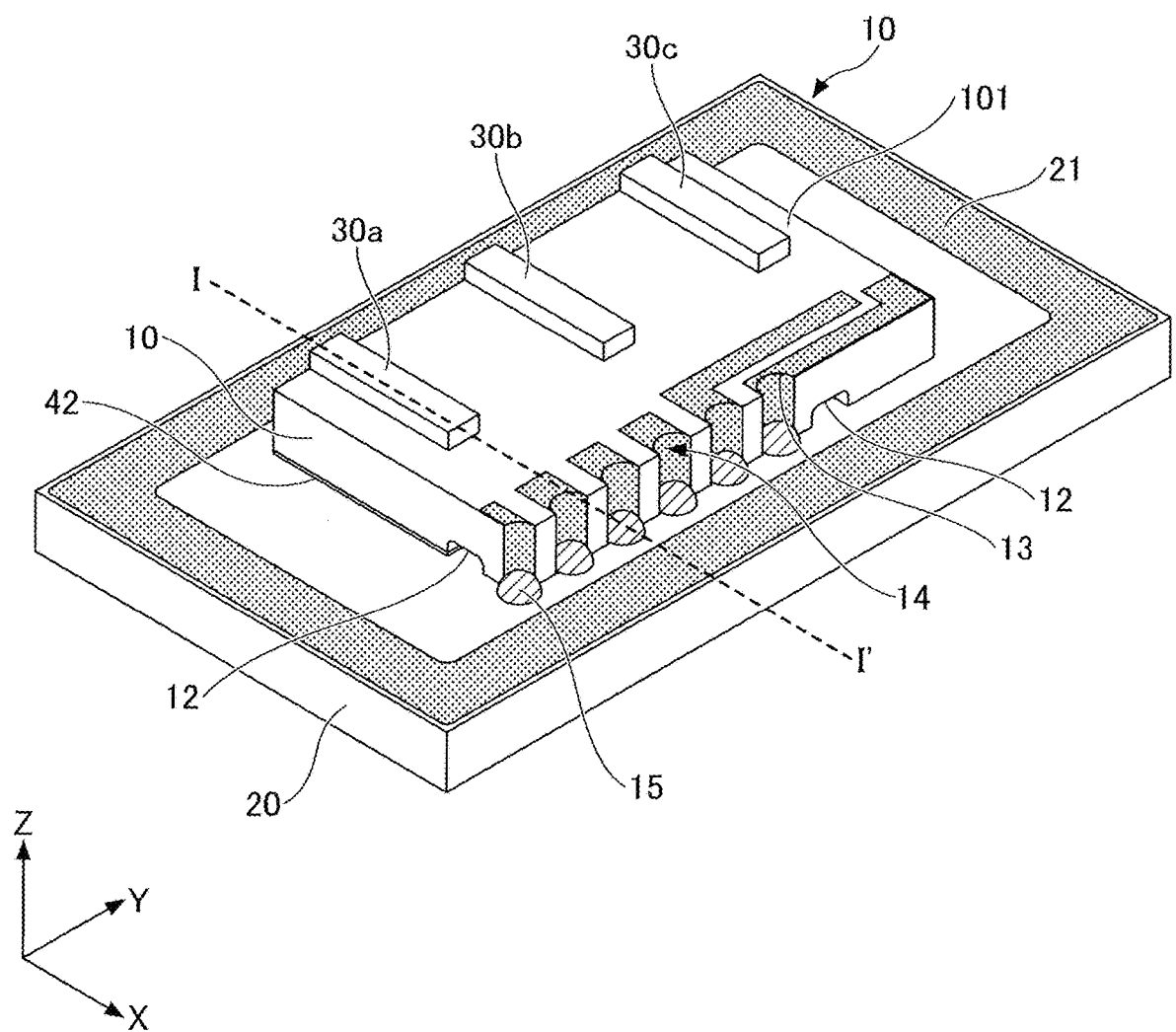
FIG. 8 is a manufacturing step diagram of the semiconductor device.

In FIG. 8, the metal ball 15 is placed in the end face through channel 13. The metal ball 15 is placed on the electrode terminal 23 of the package substrate 20. This is the state in FIG. 1. The conductive film 14 formed in the end face through channel 13 and the electrode terminal 23 are electrically connected by performing reflow on the metal ball 15 at a temperature higher than that at the time of heat joining of the heat dissipation portion 16, for example, at 280° C. In this way, wirings at a narrow pitch are formed. Note that the metal ball 15 can be formed on the package substrate 20, and the submount 10 can be disposed such that a position of the formed metal ball 15 is aligned with a position of the end face through channel 13.

A melting point or a remelting temperature of the first joint member 42 that fixes the heat dissipation portion 16 is higher than a reflow temperature being a melting temperature of the metal ball 15, and thus the submount 10 remains fixed during reflow. Even in a case in which a part of the first joint member 42 is present in the groove 12, the first joint member 42 does not melt at the reflow temperature and thus does not contact the electrode terminal 23 and the metal ball 15.

By separately performing the physical joining of the heat dissipation portion 16 and the electrical connection in the end face through channel 13 in two stages, a material of the first joint material 41 different from that of the metal ball 15 can be used. Heat dissipation efficiency can be improved while reducing the size of the semiconductor device 1, and a short circuit in the package can be prevented. Further, the submount 10 can be mounted on the package substrate 20 with high accuracy.

Figure 9A:
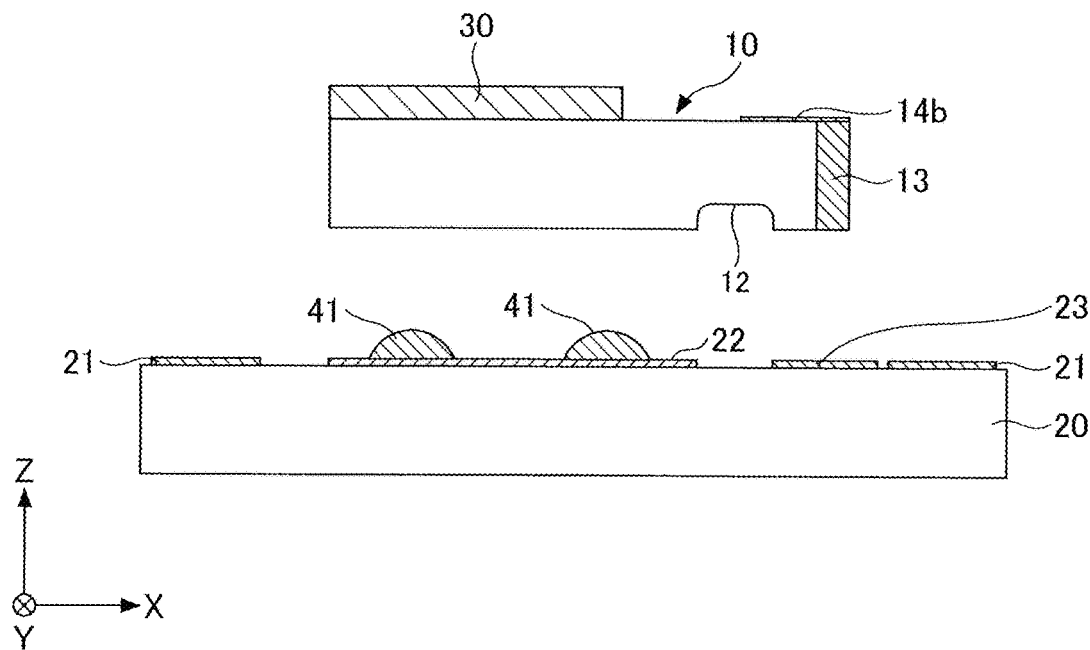
FIG. 9A is a mounting step diagram in a cross section taken along a line I-I' in FIG. 8.

FIGS. 9A to 9E each illustrate a mounting step of the submount 10 by two-stage joining by a cross section taken along a line I-I' in FIG. 8. FIG. 9A corresponds to the state in FIG. 5. The first joint material 41 is disposed on the metal pattern 22 of the package substrate 20. As described above, the first joint material 41 is metal nanoparticles or metal nanopaste having a melting point lower than the reflow temperature of the metal ball 15. The submount 10 is adsorbed and held by a bonder or the like, the heat dissipation portion 16 is aligned with the metal pattern 22, and the end face through channel 13 is aligned with the electrode terminal 23.

Figure 9B:
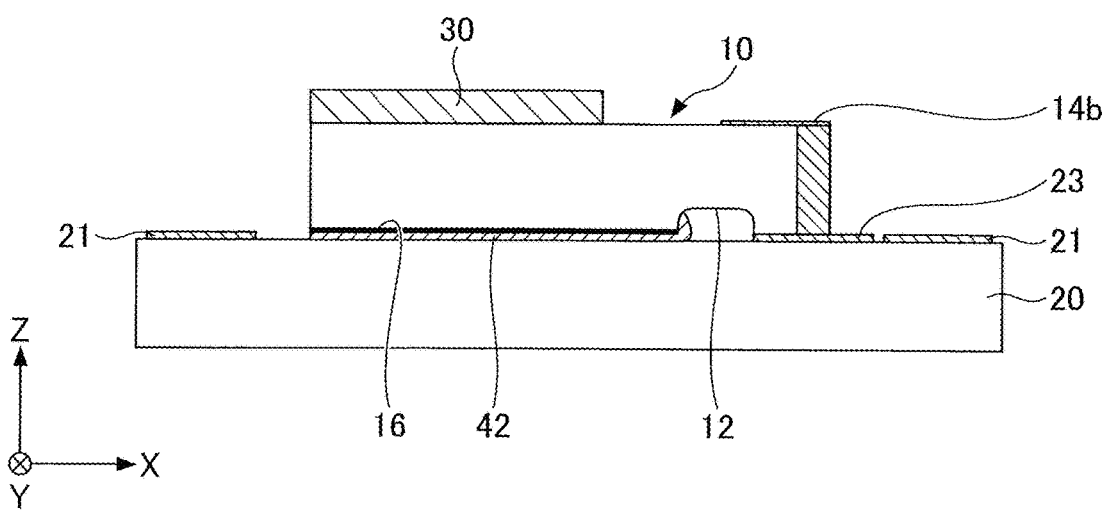
FIG. 9B is a mounting step diagram in the cross section taken along the line I-I' in FIG. 8.

In FIG. 9B, the submount 10 is physically joined to the package substrate 20 by the first joint material 41. FIG. 9B corresponds to the state in FIG. 7, and, for example, thermocompression bonding is performed at 250° C. By thermocompression bonding, the heat dissipation portion 16 and the metal pattern 22 are integrally joined by the first joint member 42. At this time, even when the excess first joint material 41 wets and spreads over the metal pattern 22, the excess first joint material 41 is located in the groove 12 and is prevented from coming into contact with the electrode terminal 23.

Figure 9C:
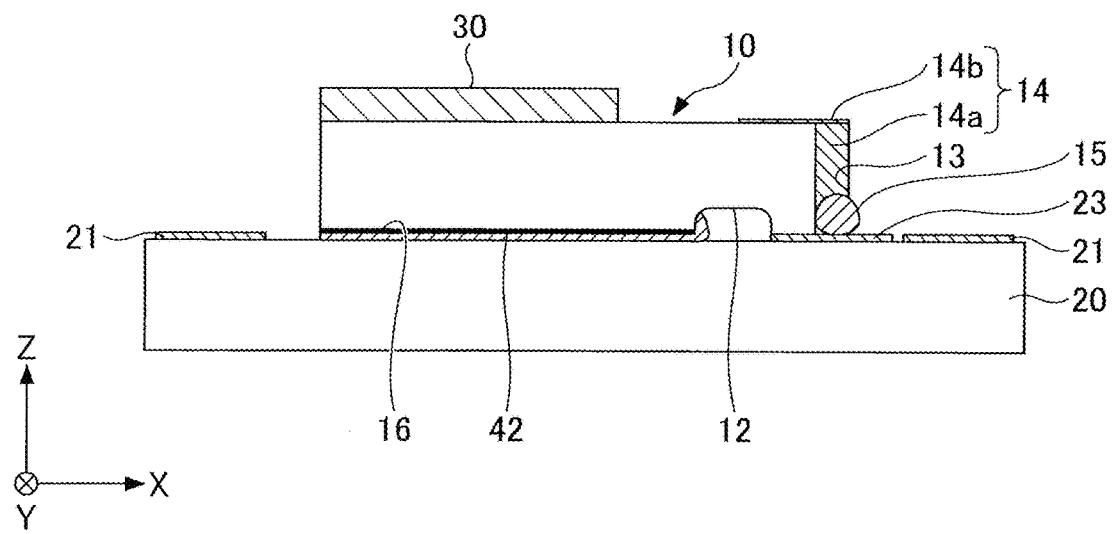
FIG. 9C is a mounting step diagram in the cross section taken along the line I-I' in FIG. 8.

In FIG. 9C, the metal ball 15 is disposed as the second joint material on the electrode terminal 23. FIG. 9C corresponds to the state in FIG. 8. Because the electrode terminal 23 and the end face through channel 13 of the submount 10 are aligned, the metal ball 15 is located in the end face through channel 13 by placing the metal ball 15 on the electrode terminal 23. By matching a curvature of the end face through channel 13 with a curvature of the metal ball 15 in advance, a substantially hemispherical portion of the metal ball 15 is located in the end face through channel 13.

Figure 9D:
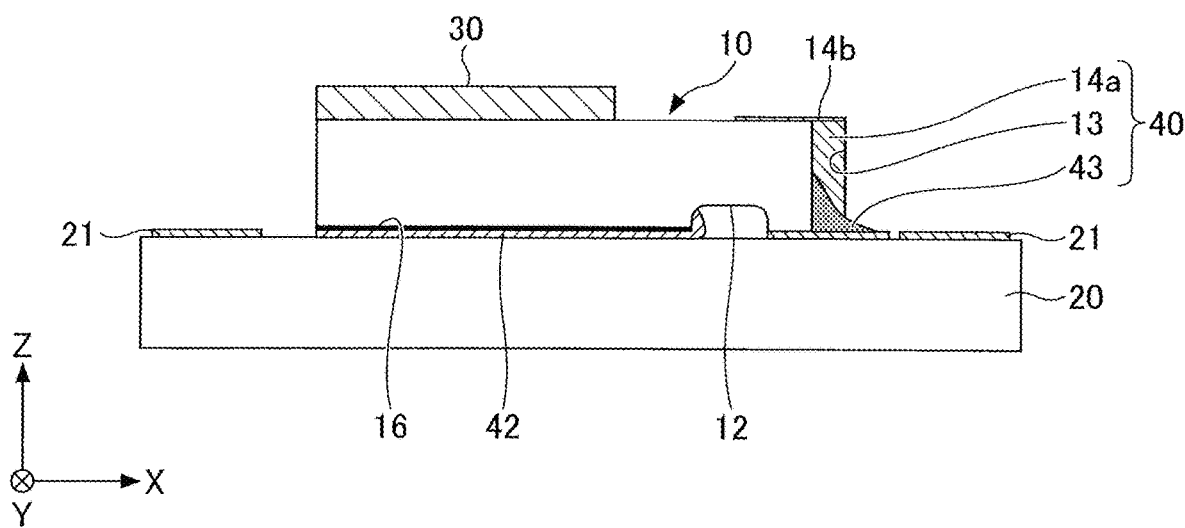
FIG. 9D is a mounting step diagram in the cross section taken along the line I-I' in FIG. 8.

In FIG. 9D, the submount 10 is electrically connected to the package substrate 20. Specifically, the metal ball 15 is melted by reflow at approximately 280° C., and the electrically conductive fillet 43 connected to the end face through channel 13 is formed. The conductive film 14a on an inner surface of the end face through channel 13 and the electrically conductive fillet 43 form the electrical connection portion 40.

Figure 9E:
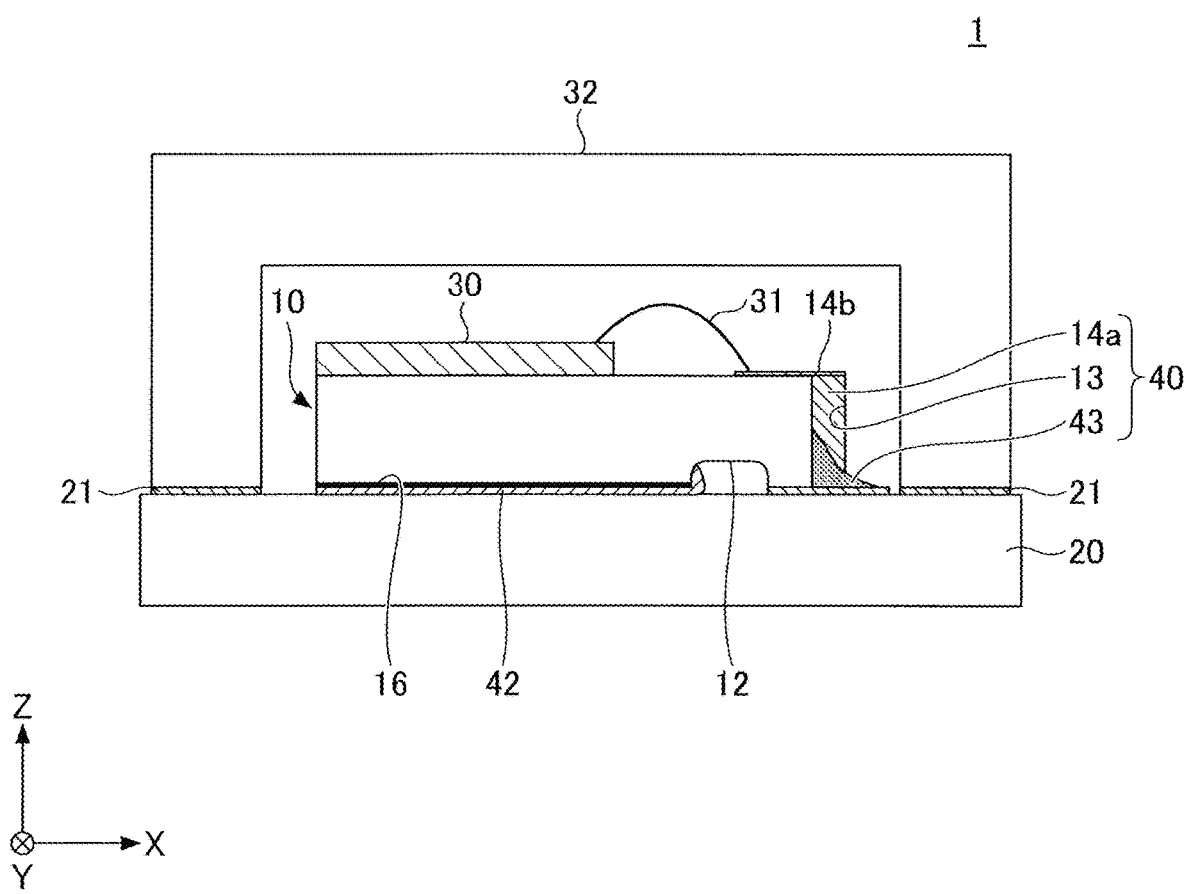
FIG. 9E is a mounting step diagram in the cross section taken along the line I-I' in FIG. 8.

In FIG. 9E, the electrode pattern 14b, and the semiconductor element 30 on the submount 10 are connected by the wire 31 or the like, and the cover 32 is put on the package substrate 20 and encapsulates the package substrate 20 and the cover 32. In a case in which the semiconductor element 30 is a surface emitting laser, a window that transmits emitted light from the semiconductor element 30 can be provided on the top surface of the cover 32. In a case in which the semiconductor element 30 is an end face emitting laser, a window that transmits emitted light from the semiconductor element 30 can be provided on the lateral surface of the cover 32.

On the back surface of the submount 10, the heat dissipation portion 16 is reliably isolated from the electrical connection portion 40, and a wiring area is reduced by an efficient wiring arrangement. Further, a short circuit in the package is prevented while a heat dissipation property is maintained in a wide range of the heat dissipation portion 16.

An example in which the submount 10 is mounted on a single package substrate 20 is described above, but a substrate in which a plurality of package substrates are arranged in a single sheet shape can be used. In this case, for example, until the state in FIG. 9D, i.e., until the submount 10 is electrically connected to the package substrate 20, a plurality of devices can be collectively manufactured, and subsequently, individual package substrates 20 can be acquired by dividing a sheet-like substrate. Alternatively, after the semiconductor element 30 on the submount 10 is electrically connected to the submount 10 by wire bonding or the like, individual package substrates 20 can be acquired by division.

Figure 10A:
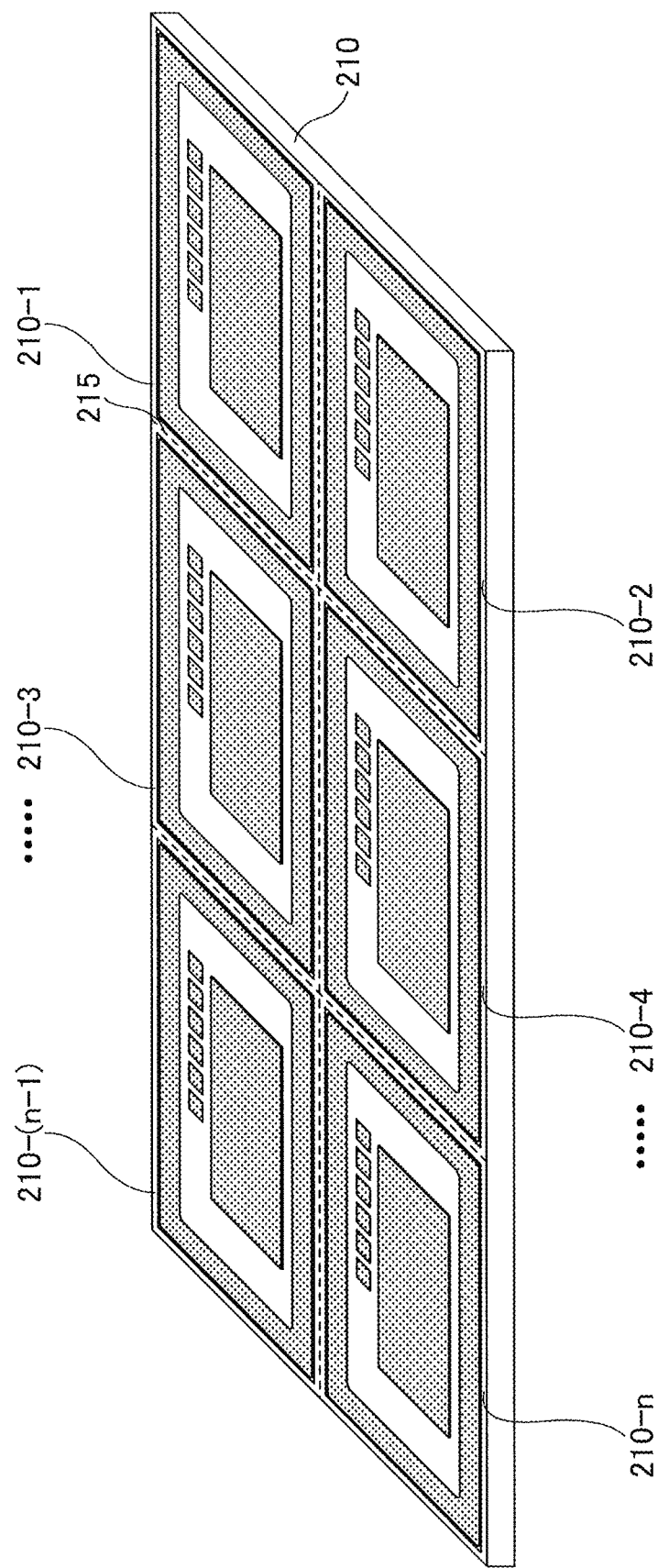
FIG. 10A is a schematic diagram of a plurality of package regions on a sheet-like substrate.
Figure 10B:
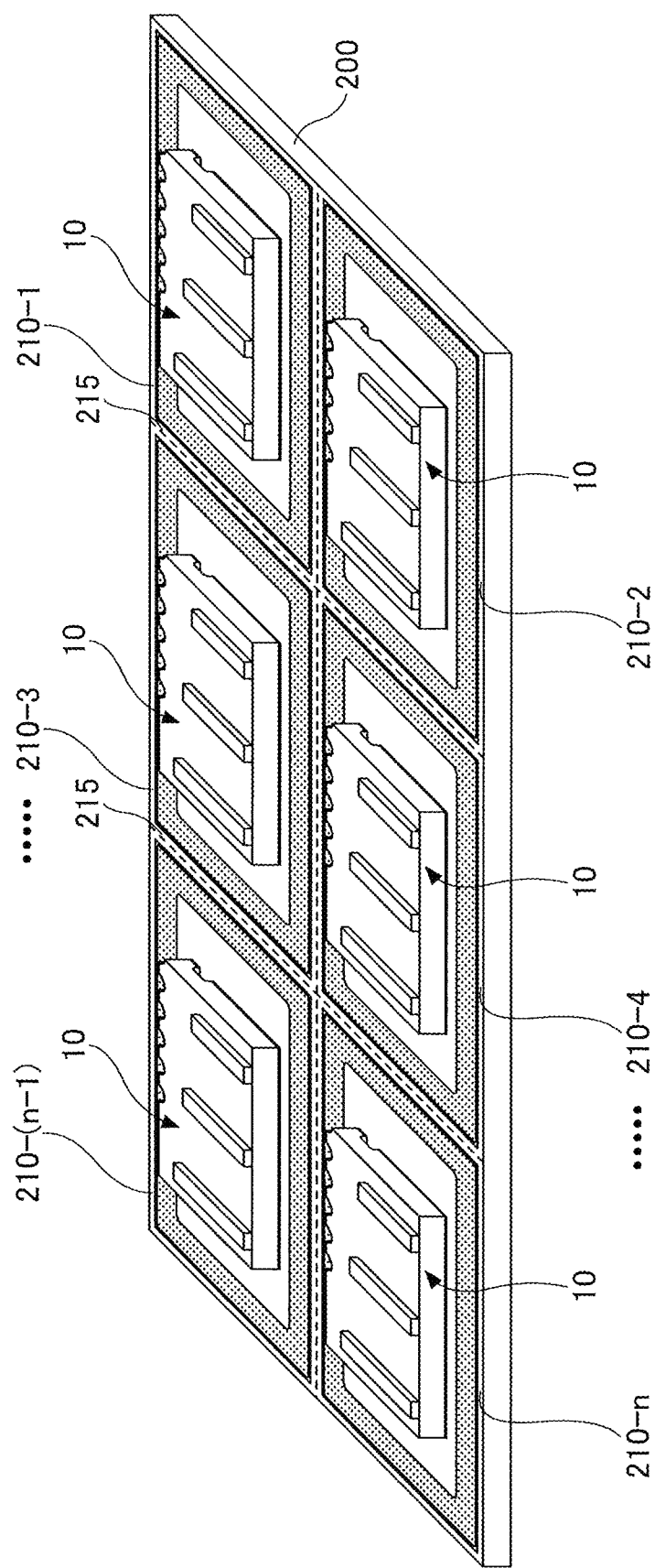
FIG. 10B is a schematic diagram of submounts mounted on the package regions.
Figure 10C:
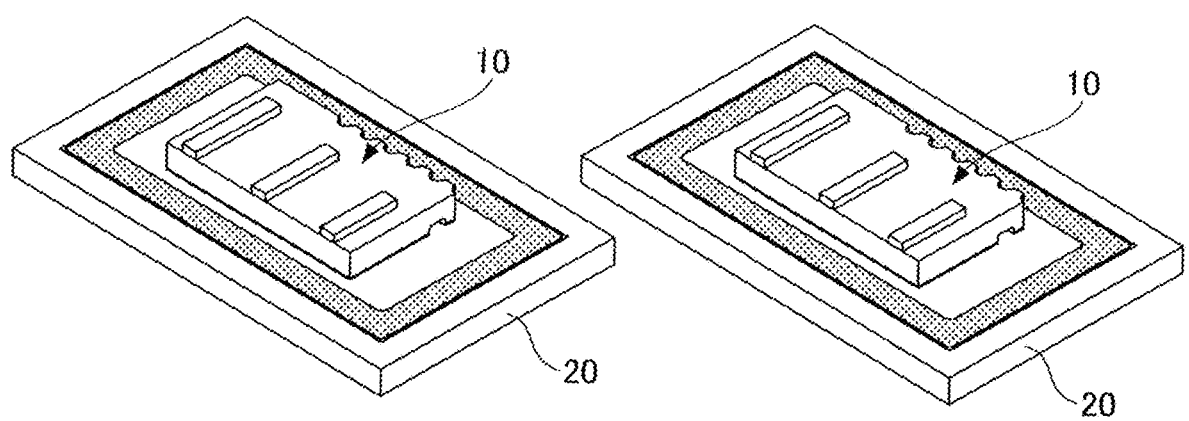
FIG. 10C is a schematic diagram of a package substrate acquired by dividing the sheet-like substrate.

FIGS. 10A to 10C each illustrate a manufacturing example when a sheet-like substrate 200 is used. In FIG. 10A, the metal pattern in FIG. 4 is formed in each of package regions 210-1 to 210-n (collectively referred to as "package regions 210" as appropriate) of the sheet-like substrate 200. The plurality of package regions 210 are partitioned by a division region 215.

In FIG. 10B, the steps in FIGS. 9A to 9D are collectively performed in the plurality of package regions 210, and the submount 10 is electrically connected to the corresponding package region 210. Specifically, after the heat dissipation portion 16 (see FIG. 2) is physically fixed, the metal ball 15 is melted, and the electrical connection portion 40 including the electrically conductive fillet 43 is formed.

In FIG. 10C, the sheet-like substrate 200 is divided along the division region 215, and individual package substrates 20 each including the submount 10 mounted thereon is acquired. The sheet-like substrate 200 can be divided by an appropriate method such as dicing division and pressing division. Subsequently, the cover 32 is put on each of the individual package substrates 20 (see FIG. 9E), and the plurality of semiconductor devices 1 are acquired.

Collective formation of semiconductor devices improves manufacturing efficiency. In the semiconductor device 1 according to the embodiment, a wiring area is reduced by an efficient wiring arrangement, and a size reduction is achieved. Therefore, an area of the package region 210 can be reduced, and the number of the package regions 210 included in one sheet-like substrate 200 can be increased.

As described above, after physical joining in a first stage in which the heat dissipation portion 16 is fixed to the package substrate 20 by the first joint material 41, joining in a second stage in which an electrical connection is established by the end face through channel 13 is performed. Because the submount 10 is reliably fixed to the package substrate 20 during the electrical connection in the second stage, the end face through channel 13 can be reliably electrically connected to the electrode terminal 23 at a narrow pitch.

Because the excess first joint material 41 is located inside the groove 12 in the physical joining in the first stage, a short circuit with the electrical connection portion can be prevented.

The metal ball 15 is formed of a low melting point solder material, and thus an influence on the semiconductor element 30 is suppressed. Because a melting point of the first joint member 42 is higher than the reflow temperature, physical joining between the submount 10 and the package substrate 20 is maintained even during reflow.

The heat dissipation portion 16 is formed over a wide range of the back surface 102 of the submount 10 except for the region for the electrical connection, and thus the heat dissipation portion 16 has a high heat dissipation effect. Because the heat dissipation portion 16 is separated from the electrical connection portion by the groove 12, occurrence of a short circuit is suppressed through the mounting step.

The configuration and the manufacturing method of the semiconductor device 1 are described above based on the specific examples, but the present invention is not limited to the examples described above. An arrangement of the groove 12 is not limited to the L-shaped arrangement as in FIG. 2, and the groove 12 can be disposed in an appropriate position in which a wide space for the heat dissipation portion 16 can be secured. The groove 12 can be a groove having a semi-circular cross section, a V-shaped cross section, or the like as long as the groove 12 can house an excess joint member by separating the heat dissipation portion 16 and the electrical connection portion. A radius of curvature of the metal ball 15 and a radius of curvature of the end face through channel 13 do not necessarily need to be the same, and a curvature can be adjusted such that most of the metal ball 15 is located in the end face through channel 13.

The invention claimed is:

1. A semiconductor device comprising:
   a plurality of semiconductor elements;
   a submount having a first surface on which the plurality of semiconductor elements are mounted, a second surface located on a side opposite the first surface, and a plurality of lateral surfaces located between the first surface and the second surface, wherein the plurality of lateral surfaces include a first lateral surface, a second lateral surface opposite the first lateral surface, a third lateral surface extending between the first and second lateral surfaces, and a fourth lateral surface extending between the first and second lateral surfaces opposite the third lateral surface, and wherein the submount comprises:
- a groove located at the second surface, the groove having a first overall end located at the first lateral surface and a second overall end located at the third lateral surface,
- a heat dissipation portion located at the second surface, and
- an electrode pattern located at the first surface, the electrode pattern comprising a plurality of electrode pattern portions;

a package substrate on which the submount is mounted;
a first joint member that physically joins the heat dissipation portion to the package substrate; and
a plurality of connection portions located on the first lateral surface, wherein each connection portion electrically connects a respective one of the electrode pattern portions to the package substrate; wherein:
the heat dissipation portion and the plurality of connection portions are separated by the groove and are electrically insulated from each other.

2. The semiconductor device according to claim 1, wherein, in a plan view of the second surface of the submount:
the groove is L-shaped, and
the heat dissipation portion is L-shaped and has an area larger than that of the groove.

3. The semiconductor device according to claim 1, wherein:
the second surface comprises:
- a first region in which the heat dissipation portion is provided, and
- a second region separated from the first region by the groove; and each connection portion is formed on a part of the first lateral surface and a part of the second region, and is separated from the groove.

4. The semiconductor device according to claim 1, wherein:
a part of the first joint member is located in the groove.

5. The semiconductor device according to claim 1, wherein:
at least one semiconductor element of the plurality of semiconductor elements is an optical semiconductor element or a power semiconductor element.

6. The semiconductor device according to claim 1, wherein:
the first joint member and the second joint member are formed of different materials.

7. The semiconductor device according to claim 1, wherein:
the first joint member is formed of a material containing nanoparticles of at least one element selected from Ag, Cu, and Au, or a material containing microparticles of at least one element selected from Ag, Cu, and Au.

8. The semiconductor device according to claim 1, wherein:
a melting temperature of the first joint member before joining the submount and the package substrate is lower than a melting temperature of the second joint member before electrically joining the submount and the package substrate, and a melting temperature of the first joint member after joining the submount and the package substrate is higher than a melting temperature of the second joint member before electrically joining the submount and the package substrate.

9. The semiconductor device according to claim 1, wherein:
the first lateral surface comprises a plurality of end face through channels extending from the first surface to the second surface; and
each connection portion is located in a respective one of the end face through channels.

10. The semiconductor device according to claim 9, wherein:
each connection portion comprises:
- an electrically conductive film that covers an inner surface of the respective end face through channel, and
- the second joint member, which comprises an electrically conductive fillet that is in contact with the electrically conductive film and a surface of the package substrate, wherein the electrically conductive fillet has a shape in which an outer lateral surface of the electrically conductive fillet and the electrically conductive film are increasingly separated as the outer lateral surface gets closer to the package substrate; and the end face through channels are separated from the groove.

11. The semiconductor device according to claim 10, wherein:
the package substrate comprises an electrode terminal; and
the electrically conductive fillet is in contact with a surface of the electrode terminal.

* * * * *